United States Patent [19]

Flaxl

[11] Patent Number: 5,621,396
[45] Date of Patent: Apr. 15, 1997

[54] METHOD AND APPARATUS WITH ADAPTIVE TRANSPONDER PLUCKING

[75] Inventor: Thomas J. Flaxl, Train, Germany

[73] Assignee: Texas Instruments Incorporated, Dallas, Tex.

[21] Appl. No.: 269,471

[22] Filed: Jun. 30, 1994

[51] Int. Cl.[6] ................................................. H03L 3/00
[52] U.S. Cl. .......................... 340/825.54; 340/825.31; 342/51; 342/42; 342/44
[58] Field of Search .................. 340/825.31, 825.54, 340/442, 448, 542, 933, 941; 342/51, 42, 44

[56] References Cited

U.S. PATENT DOCUMENTS

| | | | |
|---|---|---|---|
| 4,333,072 | 6/1982 | Beigel | 340/825 |
| 4,364,043 | 12/1982 | Cole et al. | 340/933 |
| 5,025,492 | 6/1991 | Viereck | 340/825.54 |
| 5,028,918 | 7/1991 | Giles et al. | 340/825.54 |
| 5,036,308 | 7/1991 | Fockens | 340/572 |
| 5,041,826 | 8/1991 | Milheiser | 340/825 |
| 5,053,774 | 10/1991 | Schuermann et al. | 342/44 |
| 5,227,740 | 7/1993 | Steinhagen et al. | 331/166 |
| 5,266,926 | 11/1993 | Beigel | 340/572 |
| 5,287,112 | 2/1994 | Schuermann | 342/51 |
| 5,287,113 | 2/1994 | Meier | 342/51 |
| 5,345,231 | 9/1994 | Koo et al. | 340/825.54 |
| 5,347,263 | 9/1994 | Carroll et al. | 340/825.34 |
| 5,396,251 | 3/1995 | Schuermann | 342/51 |
| 5,410,315 | 4/1995 | Huber | 342/42 |
| 5,450,088 | 9/1995 | Meier et al. | 342/51 |

FOREIGN PATENT DOCUMENTS

| | | | |
|---|---|---|---|
| 596521 | 5/1994 | European Pat. Off. | 340/825.54 |
| 5172939 | 7/1993 | Japan | 340/825.54 |

*Primary Examiner*—Michael Horabik
*Assistant Examiner*—William H. Wilson, Jr.
*Attorney, Agent, or Firm*—Rebecca A. Mapstone; James C. Kesterson; Richard L. Donaldson

[57] ABSTRACT

A method and apparatus with adaptive transponder plucking is provided in which oscillations from a resonant circuit (12 and 14) are maintained by coupling power from a capacitor (18) through a switch (26) to the resonant circuit (12 and 14). The switch (26) is controlled by adaptive pluck circuitry. The adaptive pluck circuitry includes peak level detector (22) and comparator (24). When the peak level of an oscillating signal from the resonant circuit (12 and 14) falls below a reference voltage, the switch (26) is activated to couple power to the resonant circuit (12 and 14).

17 Claims, 1 Drawing Sheet

METHOD AND APPARATUS WITH ADAPTIVE TRANSPONDER PLUCKING

TECHNICAL FIELD OF THE INVENTION

This invention relates generally to electronic devices, and more particularly to a method and apparatus with adaptive transponder plucking.

BACKGROUND OF THE INVENTION

Significant advances have been made in recent years in the development of wireless communication systems for remote monitoring. In a typical system of that kind, a transponder is remotely located to monitor various parameters, such as temperature, status, and location, among others. Such wireless, remote monitors are attractive because they are reliable, inexpensive, and rugged.

The transponder includes a resonant circuit used for receiving signals (typically radio frequency ("RF") signals) from an interrogation unit, and for transmitting RF signals containing monitoring information back to the interrogation unit. Furthermore, energy from the signals received by the resonant circuit is stored and used to power the transponder, thus eliminating the need for power supplies in many applications. The stored power is also used to excite the resonant circuit for transmission of signals back to the interrogation unit.

To conserve energy, the resonant circuit is not continuously excited. Rather, it is initially excited and then periodically supplied with additional energy to maintain oscillation. The maintenance energy is needed because the resonant circuit has various losses, and other components of the transponder also cause a damping of the oscillation, thus resulting in decay of the oscillation. This re-excitation with maintenance energy pulses is referred to as plucking.

With existing transponders, the plucking function is initiated after a fixed number of oscillations. For example, the plucking function may be initiated after every eight oscillations (also known as ringings) of the resonant circuit. Unfortunately, the quality-factor of resonant circuits from transponder to transponder is not constant, and thus the frequency of the plucking function must be correspondingly changed for proper operation. For example, a plucking function that is performed every eight oscillations may be insufficient to maintain oscillations in a low quality-factor resonant circuit. Moreover, the quality-factor of individual resonant circuits may not be constant, due to nearby metal or circuits used to dampen other nearby resonators.

SUMMARY OF THE INVENTION

Therefore, a need has arisen for a method and apparatus for performing the plucking function that will work with high quality-factor, low quality-factor, and variable quality-factor resonant circuits.

In accordance with the teachings of the present invention, a method and an apparatus with adaptive transponder plucking are provided which substantially eliminate or reduce disadvantages and problems associated with prior art plucking function systems.

In particular, a system with adaptive plucking is provided in which a resonant circuit is operable to generate an oscillating signal. A peak level detector is operable to detect a peak level of the oscillating signal. Coupled to the peak level detector is a comparator that compares the peak level with a reference voltage. A switch is coupled to the resonant circuit and the comparator, and couples power to the resonant circuit under control of the comparator. In particular, the switch couples power to the resonant circuit when the peak level of the oscillating signal is below the reference voltage.

In another embodiment, a counter is also provided to count cycles of the oscillating signal. The switch couples power to the resonant circuit under control of the comparator and the counter. In the particular embodiment with the counter, the switch couples power when the peak level of the oscillating signal is below the reference voltage or when the counter counts a preset number of cycles.

Furthermore, a method of maintaining an oscillating signal with adaptive plucking is provided in which an oscillating signal is initiated in a resonant circuit. A peak level of the oscillating signal is detected and compared with a reference voltage. Power is coupled to the resonant circuit in response to the comparison of the peak level and the reference voltage. In a particular embodiment, cycles of the oscillating signal are counted, and power is coupled to the resonant circuit in response to the comparison of the peak level with the reference voltage and to the count of the cycles of the oscillating signals.

An important technical advantage of the present invention is its adaptive plucking function, which accommodates a wide range of quality-factor resonant circuits. In particular, resonant circuits with lower quality-factors are plucked frequently enough to maintain adequate signal strength, while resonant circuits with higher quality-factors are plucked only when necessary, thereby conserving power.

Another important technical advantage of the present invention is that it combines adaptive plucking with plucking at a preset frequency. Thus, with higher quality-factor resonant circuits the plucking function can be performed according to a preset plucking frequency, thereby maintaining a relatively high signal strength. Furthermore, lower quality-factor resonant circuits will be plucked adaptively, thereby assuring high signal strength.

BRIEF DESCRIPTION OF THE DRAWINGS

For a more complete understanding of the present invention and the advantages thereof, reference is now made to the following description taken in conjunction with the accompanying drawings in which like reference numbers indicate like features and wherein.

DETAILED DESCRIPTION OF THE INVENTION

Figure 1:
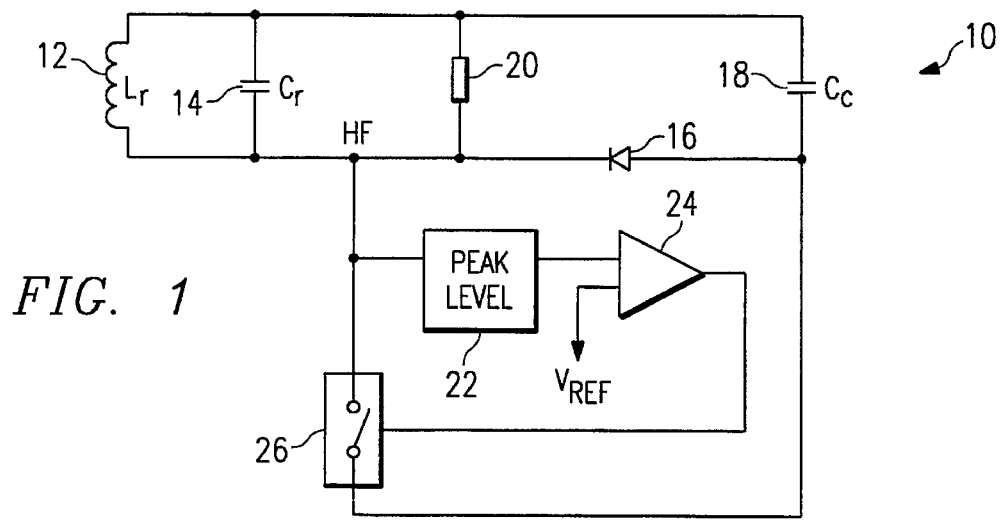
FIG. 1 is a schematic of a resonant circuit and adaptive plucking circuit according to the teachings of the present invention.

FIG. 1 illustrates a resonant circuit and adaptive plucking circuit 10 according to the teachings of the present invention. The circuit 10 of FIG. 1 will typically reside in a transponder that receives and transmits radio frequency ("RF") signals from and to an interrogation unit. The transponder can be used for measuring various physical parameters, and for providing status or location information.

Examples of a transponder and an interrogation unit are provided in U.S. Pat. No. 5,053,774, issued Oct. 1, 1991, and entitled "TRANSPONDER ARRANGEMENT." That patent is herein incorporated by reference.

In circuit 10, reception and transmission of RF signals are accomplished with a parallel resonant circuit, which includes coil 12 and capacitor 14. Coupled in parallel with the resonant circuit are diode 16 and capacitor 18, as well as load 20. Energy received by the resonant circuit from received RF signals is rectified by diode 16 and stored in storage capacitor 18. Load 20 is included to represent various other loads, such as other circuitry within the transponder or, as will be discussed, damping effects from circuits on other nearby resonant circuits.

Also shown in FIG. 1 is peak level detector 22. Peak level detector 22 is coupled to the oscillating signal generated by the resonant circuit, and designated "HF." Peak level detector 22 is also coupled to comparator 24. Comparator 24 compares the output of peak level detector 22 with a reference voltage, $V_{Ref}$. The output of comparator 24 is coupled to a switch 26. Switch 26 is controlled by comparator 24, and couples energy from the storage capacitor 18 to the resonant circuit. Switch 26 may be, for example, a transistor, such as a metal oxide semiconductor field effect transistor ("MOSFET").

The plucking function is performed by closing switch 26. With the closure of switch 26, energy is transferred from storage capacitor 18 to the resonant circuit. This transfer of energy increases the amplitude of the oscillation generated by the resonant circuit. Therefore, the signal strength of the signal transmitted to the interrogation unit is maintained at a sufficiently high level for adequate communication.

With the present invention, peak level detector 22 detects the peak amplitude level of the signal HF. If this peak level falls below the reference voltage $V_{Ref}$, then comparator 24 will cause switch 26 to close. The reference voltage $V_{Ref}$ is set so that the plucking function occurs when the signal strength of the signal transmitted by the transponder is below some set point indicating inadequate signal strength.

By controlling switch 26 to close only when the peak level of the HF signal is below a reference voltage, significant technical advantages result. For example, with systems that apply the plucking function after a preset number of cycles, signal strength may be too low, or oscillation stopped altogether, if the preset plucking frequency is too low. Such problems may arise, for example, with low quality-factor resonant circuits. Similarly, if the preset plucking frequency is too high, then energy is wasted, since plucking occurs more often than necessary. This may occur, for example, with high quality-factor resonators.

With the adaptive plucking function of the present invention, however, plucking occurs only when necessary, thus assuring appropriate signal strength and also conserving power. Thus a wide range of quality-factor resonators are accommodated, and the plucking function need not be tailored for each transponder.

Typical interrogation units include circuitry for damping the oscillations of the interrogation unit's resonant circuit when switching from the transmit mode to receive mode. When such an interrogation unit is relatively close to a transponder, this damping may also cause damping of the transponder's resonant circuit. This results in near distance reading holes, wherein interrogation units cannot read transponders if they are too close. The present invention assists in avoiding this problem by providing additional plucks that insure that the signal strength of the signal transmitted by the transponder's resonant circuit is sufficiently high.

Figure 2:
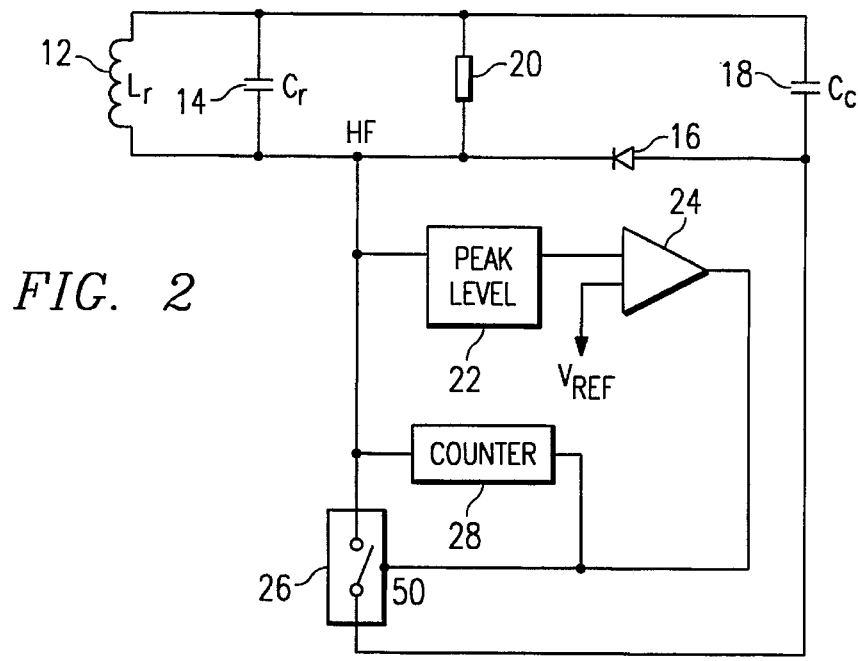
FIG. 2 is a schematic of another embodiment of a resonant circuit and adaptive plucking circuit according to the teachings of the present invention.

FIG. 2 illustrates another embodiment of the present invention. The circuit of FIG. 2 is similar to that of FIG. 1, except that a counter 28 is connected in parallel with peak level detector 22 and comparator 24. Counter 28 is used to insure that the plucking function occurs at least within a preset number of cycles. For example, counter 28 may be set to cause re-excitation of the resonant circuit every eight cycles. Peak level detector 22 and comparator 24 will cause plucking to occur more frequently if necessary.

By combining the preset plucking frequency of counter 28 with the adaptive plucking function of peak level detector 22 and 24, significant advantages result. For example, with resonant circuits with high quality-factors, the adaptive plucking circuitry may be only seldomly activated. Thus, the average signal strength of the signal transmitted by the transponder may be lower than desirable. By insuring plucking at the minimum frequency established by counter 28, the average signal strength of signals transmitted by such higher quality-factor resonant circuits is increased to a higher level.

Figure 3:
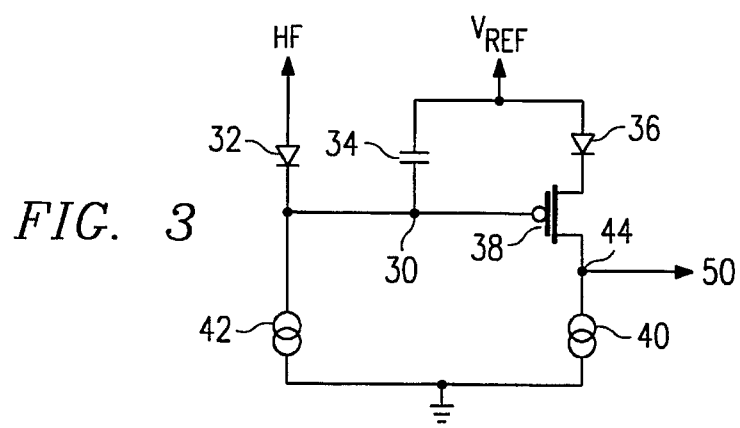
FIG. 3 is a schematic of circuit components for a particular embodiment of an adaptive plucking circuit according to the teachings of the present invention.

FIG. 3 illustrates particular circuit components which may be used to form the adaptive pluck circuitry, such as that shown by peak level detector 22 and comparator 24 in FIGS. 1 and 2. As shown in FIG. 3, signal HF is coupled to node 30 through diode 32. Node 30 is coupled through capacitor 34 to the voltage reference $V_{Ref}$. $V_{Ref}$ is also coupled through a diode 36 to a transistor 38. Transistor 38 is also coupled through a current sink 40 to ground. The gate of transistor 38 is coupled to node 30. Node 30 is also coupled to ground through a current sink 42. Node 44 is coupled to the control terminal of switch 26.

In operation, signal HF charges node 30 through diode 32. If the peak voltage of signal HF is less than $V_{Ref}$ (minus the threshold voltage of transistor 38), transistor 38 is turned on and node 44 becomes high.

The particular circuits shown in FIGS. 1–3 are exemplary only, and other circuits that perform their functions may be used without departing from the intended scope of the present invention. For example, other resonant circuits, and other circuits for detecting and comparing peak levels may be used.

In summary, a method and an apparatus with an adaptive transponder plucking function have been described. The adaptive plucking function is performed by measuring the peak level of the signal generated by the resonant circuit of a transponder. If the peak level falls below a reference voltage, then energy is supplied to the resonant circuit to maintain its resonant oscillation at a higher energy level. Furthermore, the adaptive plucking function may be combined with a minimum preset plucking frequency.

Although the present invention has been described in detail, it should be understood that various substitutions, alterations, and modifications can be made without departing from the intended scope as defined by the appended claims.

What is claimed is:

1. A system with adaptive plucking, comprising:

a resonant circuit operable to generate an oscillating signal;

a peak level detector operable to detect a peak level of said oscillating signal;

a comparator coupled to said peak level detector and operable to compare said peak level with a reference voltage; and a switch coupled to said resonant circuit and said comparator, said switch operable to couple power to said resonant circuit under control of said comparator.

2. The system of claim 1, wherein said switch couples power when said peak level is below said reference voltage.

3. The system of claim 1, wherein said resonant circuit comprises:

a capacitor; and a coil coupled in parallel with said capacitor.

4. The system of claim 1, wherein said peak level detector and said comparator comprise a single circuit.

5. The system of claim 4, wherein said single circuit comprises:

a diode coupled to said oscillating signal;

a capacitor coupled between said first diode and said reference voltage; and a transistor having a gate coupled to said diode and capacitor, said transistor operable to conduct when said peak level falls below said reference voltage.

6. The system of claim 1, and further comprising an interrogation unit operable to transmit signals to and receive signals from said resonant circuit.

7. A system with adaptive plucking, comprising:

a resonant circuit operable to generate an oscillating signal;

a peak level detector operable to detect a peak level of said oscillating signal;

a comparator coupled to said peak level detector and operable to compare said peak level with a reference voltage;

a counter operable to count cycles of said oscillating signal; and a switch coupled to said resonant circuit, said comparator, and said counter, said switch operable to couple power to said resonant circuit under control of said comparator and said counter.

8. The system of claim 7, wherein said switch couples power when said peak level is below said reference voltage or when said counter counts a preset number of cycles.

9. The system of claim 7, wherein said resonant circuit comprises:

a capacitor; and a coil coupled in parallel with said capacitor.

10. The system of claim 7, wherein said peak level detector and said comparator comprise a single circuit.

11. The system of claim 10, wherein said single circuit comprises:

a diode coupled to said oscillating signal;

a capacitor coupled between said first diode and said reference voltage; and a transistor having a gate coupled to said diode and capacitor, said transistor operable to conduct when said peak level falls below said reference voltage.

12. The system of claim 7, and further comprising an interrogation unit operable to transmit signals to and receive signals from said resonant circuit.

13. A method of maintaining an oscillating signal with adaptive plucking, comprising:

initiating the oscillating signal in a resonant circuit;

detecting a peak level of the oscillating signal;

comparing the peak level with a reference voltage; and coupling power to the resonant circuit in response to said step of comparing.

14. The method of claim 13, wherein coupling occurs when the peak level is below the reference voltage.

15. The method of claim 13, and further comprising:

transmitting signals to the resonant circuit; and receiving signals from the resonant circuit.

16. The method of claim 13, and further comprising counting cycles of the oscillating signal, and wherein the coupling of power is in response to said step of comparing and said step of counting.

17. The system of claim 16, wherein coupling occurs when the peak level is below the reference voltage or when a preset number of cycles has been counted.

* * * * *